United States Patent
Pio

(10) Patent No.: US 6,309,972 B1
(45) Date of Patent: Oct. 30, 2001

(54) METHOD OF ENHANCING PROTECTION OF DIELECTRICS FROM PLASMA INDUCED DAMAGES AND EQUIPMENT

(75) Inventor: Federico Pio, Brugherio (IT)

(73) Assignee: STMicroelectronics S.r.L., Agrate Brianza (IT)

( * ) Notice: Subject to any disclaimer, the term of this patent is extended or adjusted under 35 U.S.C. 154(b) by 0 days.

(21) Appl. No.: 09/451,535

(22) Filed: Dec. 1, 1999

(30) Foreign Application Priority Data

Dec. 2, 1998 (EP) .................................................. 98830722

(51) Int. Cl.$^7$ .................................................. C36C 16/00
(52) U.S. Cl. ...................... 438/689; 438/660; 438/663; 257/80
(58) Field of Search .................. 438/98, 64, 567, 438/689, 20, 660, 694, 695, 663; 357/67, 81, 42; 29/572, 589, 590, 591; 156/626, 643, 646, 657

(56) References Cited

U.S. PATENT DOCUMENTS

| | | | |
|---|---|---|---|
| 4,377,436 | * | 3/1983 | Donnelly et al. ...................... 156/626 |
| 4,492,743 | * | 1/1985 | Howe ..................... 429/111 |
| 4,521,800 | * | 6/1985 | Howe ..................... 357/67 |
| 4,534,099 | * | 8/1985 | Howe ..................... 29/572 |
| 4,563,368 | * | 1/1986 | Tihanyi et al. ......................... 427/82 |
| 4,640,744 | * | 2/1987 | Howe ..................... 204/1 |
| 4,687,544 | * | 8/1987 | Bersin ..................... 156/643 |
| 4,739,378 | * | 4/1988 | Ferrari ..................... 357/13 |
| 5,789,322 | * | 8/1998 | Brown et al. ......................... 438/689 |
| 5,844,282 | * | 12/1998 | Noguchi ..................... 257/356 |
| 5,895,274 | * | 4/1999 | Lane et al. ..................... 438/795 |
| 6,111,271 | * | 8/2000 | Snyman et al. ......................... 257/80 |

FOREIGN PATENT DOCUMENTS

| | | | |
|---|---|---|---|
| 62147732 | 1/1987 | (JP) | ............................. H01L/21/302 |
| 62102564 | 5/1987 | (JP) | ............................. H01L/29/78 |
| 06124904 | 6/1994 | (JP) | ............................. H01L/21/205 |
| 07228979 | * | 8/1995 | (JP) ............................. 15/28 |

* cited by examiner

Primary Examiner—Charles Bowers
Assistant Examiner—Laura M Schillinger
(74) Attorney, Agent, or Firm—Theodore E. Galanthay; Allen, Dyer, Doppelt, Milbra & Gilchrist, P.A.

(57) ABSTRACT

During critical plasma etching steps, the wafer's surface is illuminated with electromagnetic radiation in the visible and/or in the UV spectrum having an energy and power density sufficient to increase the reverse current through protective junctions on the wafer. These protective junctions provide electrical discharge paths for electrical charges picked up by exposed conductive parts of the wafer. The induced voltages are limited to values compatible with preserving the integrity of functional dielectric layers coupled to the exposed conductive parts and to the semiconductor substrate or to another conductive part.

14 Claims, 4 Drawing Sheets

METHOD OF ENHANCING PROTECTION OF DIELECTRICS FROM PLASMA INDUCED DAMAGES AND EQUIPMENT

FIELD OF THE INVENTION

The present invention relates to fabrication techniques of semiconductor devices, and, more particularly, to preventing damages to functional dielectrics caused by voltages induced when processing a wafer in a plasma.

BACKGROUND OF THE INVENTION

In current fabrication processes for semiconductor devices according to VLSI or ULSI technology, one of the most important reliability problems is to preserve the integrity of the dielectric characteristic of thin oxide layers during treatment of the wafers. Thin oxide layers include gate oxides and interpoly dielectrics, for example. The criticality of this requirement is increasingly more important because of the technological advances that imply a continuous reduction or scaling down of the thickness of functional dielectric films. For example, a gate oxide thickness on the order of 5 nm or less are commonly used.

Many process steps may potentially degrade or damage the dielectric characteristic of such functionally active oxides. However, it is well known that among the most damaging conditions under this profile are those that occur during dry etching in a plasma when patterning the first levels of metallization. Another such condition is at the beginning of the exposure of the wafer to the plasma when depositing isolation layers using plasma enhanced chemical vapor deposition (PECVD), for example.

Some of the structural features of electrically conducting material on the surface of the wafer are directly exposed to the plasma. These structural features are customarily placed on a plate electrode or platen of the reactor that cooperates with another electrode in causing ionization of a gaseous mixture introduced in the evacuated chamber by injecting radio frequency (RF) signals to electrically charge the structural features. Consequently, these structures act as antennas and are electrically charged.

The electric path may include the electric charge of an active dielectric film, such as a gate oxide or an interpoly dielectric. The strong electric field that is induced on the dielectric may damage it due to a breakdown voltage across the wafer substrate and the electrode on which the wafer is placed. The effects of breakdown currents through thin gate or interpoly isolation dielectrics may irreversibly degrade the dielectric properties. To limit below an empirically determined value the electric stress that may be induced in the dielectric, appropriate design approaches are implemented.

These practices are based on checking the RF energy conditions. For example, this may be done by limiting the ratio between the exposed area of the conducting material on the wafer surface (antenna) and the coupling area with the dielectric layer to limit the total amount of electric charge that may be accumulated. These practices are not easily adaptable to changing process conditions.

Another widely used approach, where it is difficult or unpractical to assure safe conditions, includes forming dedicated protective diodes in parallel with the dielectric to be protected. These protective diodes are placed between the exposed conductor and the semiconductor substrate to provide a discharge path from the conductor material exposed to the plasma and the substrate, and vice-versa. This type of protection is effective when the junction (protecting diode) is directly biased, but may be insufficient when the difference of potential caused by the charging of the exposed conductor reverse biases the protecting diode. This reverse biasing condition for a gate dielectric is inevitable since the protecting diode must not effect normal operating conditions of the finishing product.

In case of gates directly connected to input pins of the device, the protecting diodes will continue to function as a protection device from accidental electrostatic discharges that may hit the pin while handling the device. The protection diodes are typically N+/P or P+/N diodes, or Zener diodes. FIGS. 1 and 2 show a typical arrangement of Zener diodes for protecting the gate dielectric of a CMOS inverter.

The Zener voltage must suit the designed supply voltage of the circuit and the peculiar electrical properties of the structure to be protected. Two or more Zener diodes in series may be used to provide greater flexibility in defining the range of allowed potentials. In the two examples shown, the metal line M represents a first metal level line or a polysilicon gate line.

FIG. 3 shows a cross-section of a semiconductor device during the fabrication process and, more particularly, at the stage when a first metal level is being patterned by masking. The first metal level follows the formation of the gate structures of the devices by patterning a G layer of polysilicon.

During the plasma etching which patterns the metal layer M, the charging path of a gate dielectric passes through the interconnection or via V between the polysilicon G and the metal layer M. The gate dielectric is protected by forming an N+/P substrate junction and by connecting it through a contact P to the conductor layer M. A similar protecting diode is also shown in the right side portion of the figure.

FIG. 4 shows another arrangement for protecting against an excessive charging of the gate polysilicon G by forming Zener junction between the P+ and N+ regions. The contact towards the substrate is formed through the P contact and the P+ diffusion, as shown at the leftmost portion of the cross-sectional view.

The constant technological advances in the fabrication processes for scaling down integrated structures makes it ever more difficult to ensure sufficient protection of dielectric layers as they become thinner, and thus more delicate in terms of preserving their optimal dielectric properties. In these circumstances, the distribution and the structure of the protective junctions become more critical.

SUMMARY OF THE INVENTION

An object of the present invention is to enhance the effectiveness of protective junctions in a wafer using diodes and Zener diodes, for example, for protecting dielectrics that may be damaged by discharge currents and voltages induced during plasma treatments of the wafer while being processed.

The effectiveness of the protection diode formed on the wafer is significantly improved by increasing the reverse current through a Zener junction by illuminating the wafer surface with electromagnetic radiation in the visible or UV spectrum while the wafer is being exposed to the plasma inside the chamber of the reactor. The improved effectiveness of the protection diode is reflected by an increase in the process yield.

A strong illumination of the wafer surface inside the plasma treatment reactor increases the availability of electron-hole pairs in the depleted region of the protection diodes functionally formed in connection with the structure to be protected during the plasma treatments. This causes a discharge of the parts of the conductor material on the wafer surface that are exposed to the plasma. The level of induced voltage and stress on the dielectric that is electrically coupled to the charging part are limited. This occurs even when the sign of the potential induced by the plasma on the latter reversely biases the protection diodes.

To be fully effective, the illumination of the wafer surface should have a level of at least 1 mW/cm$^2$. This level is in a region of the emission spectrum of a light source of energy greater than the forbidden band energy, which for silicon is about 1.1 eV. Greater power densities may be used, particularly in relation to the transparency of stacked layers in the active areas of the protection diodes on the underlying surface of the silicon substrate. The power densities also take into account possible shading effects of the stacked layers.

The electromagnetic radiation source may be an incandescence lamp, a high or low pressure gas discharge lamp or a laser. Preferably, high or low pressure gas discharge lamps having emission wavelengths in the visible and/or in the UV spectrum show significant efficiency in effectively stimulating the generation of electron-hole pairs. High pressure mercury gas lamps are particularly effective.

The illumination may be constant, or alternatively, the wafer surface may be sequentially scanned by a focused light beam. A continuous or pulsed laser source is also adequate for providing high intensity of a selected wavelength. The radiation source may be installed either inside or outside the evacuated chamber of the plasma processing reactor. If placed outside, a transparent window must be provided in the chamber walls for illuminating the wafer or wafers to be treated. The illumination should be maintained generally for the entire duration of the plasma treatment, or at least during the steps of patterning the interconnection metal layer.

DETAILED DESCRIPTION OF THE PREFERRED EMBODIMENTS

Figure 1:
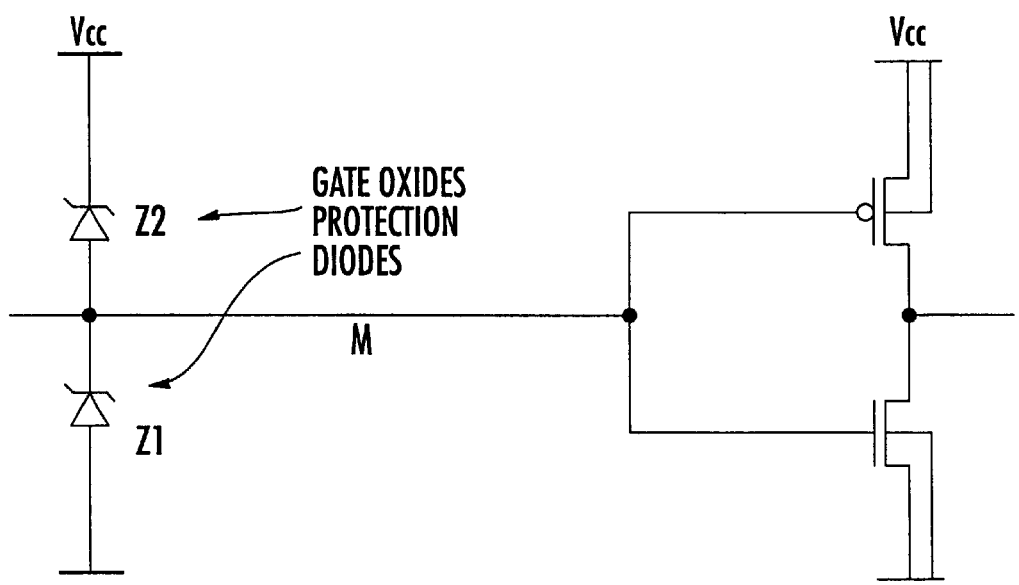
FIGS. 1–4 illustrate a protection diode layout on a wafer according to the prior art.
Figure 2:
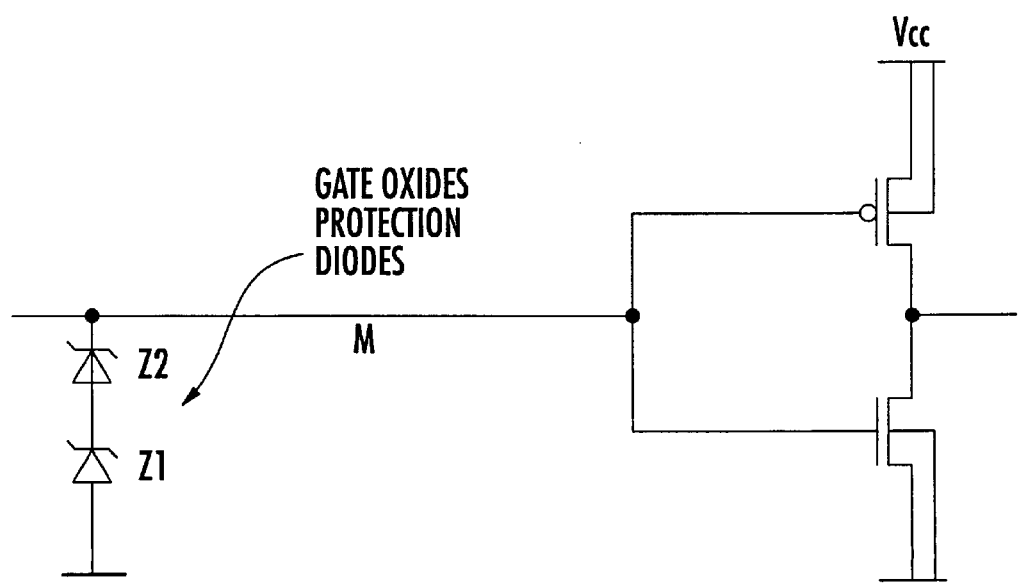
Figure 3:
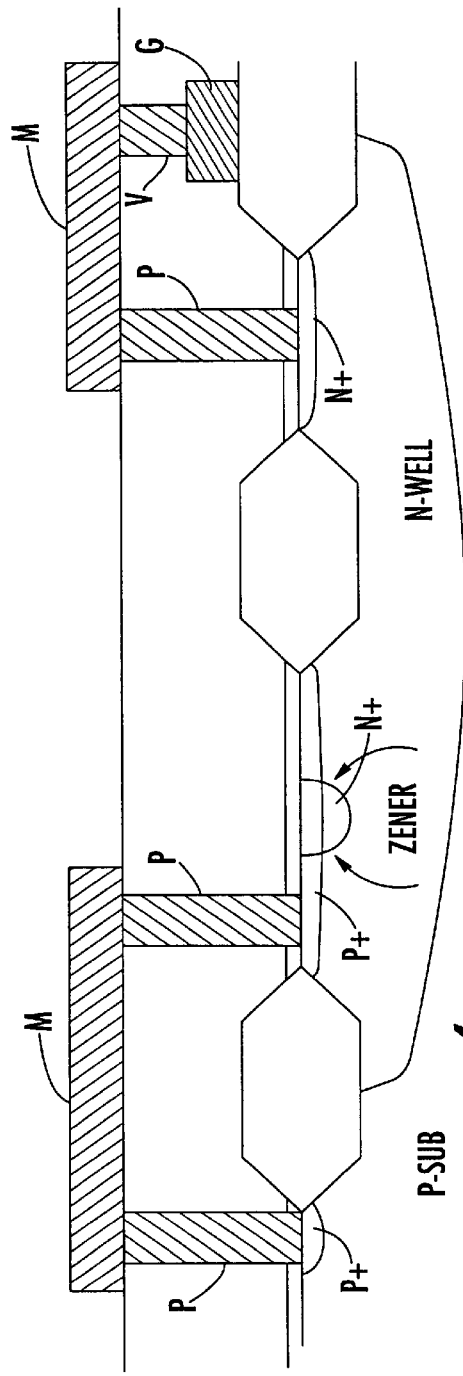
Figure 4:
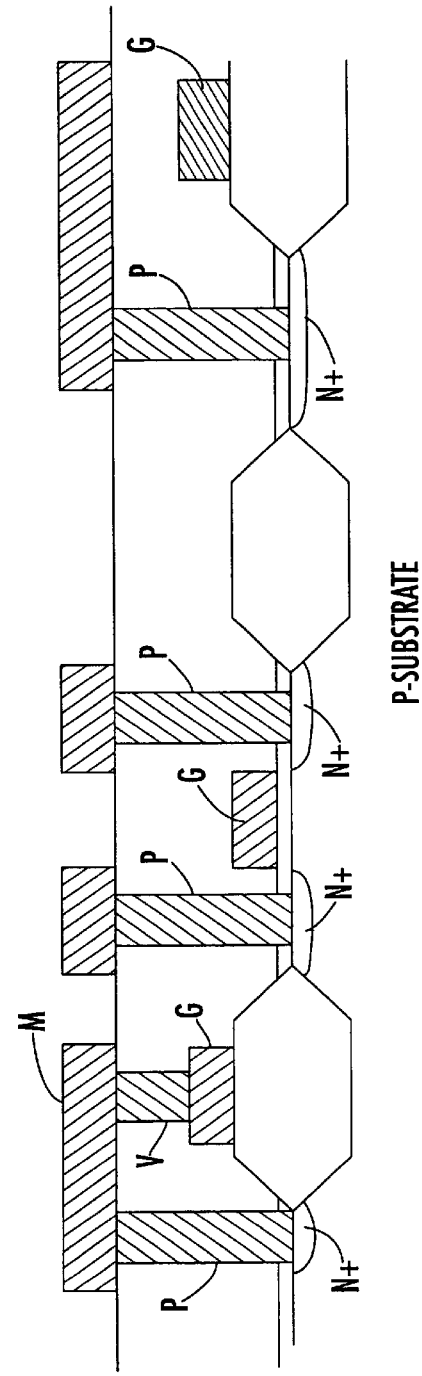
Figure 5:
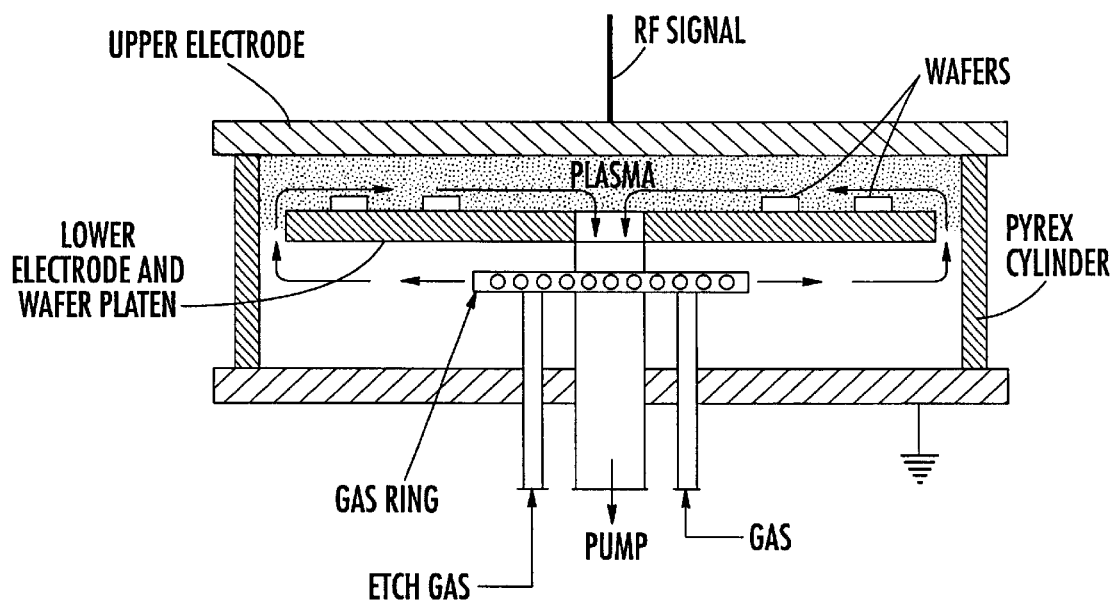
FIG. 5 is a parallel plate plasma etching system according to the prior art.

FIG. 5 illustrates a parallel plate reactor for a plasma etching system. Radio frequency energy (RF signal) is supplied through an upper electrode and the grounded wafers carried by the wafer plate. The gas is injected in the previously evacuated chamber of the reactor through a dedicated ring distribution. The plasma is largely confined in the space of separation between the upper electrode and the wafer plate. This confinement tends to increase the potential of the plasma.

Figure 6:
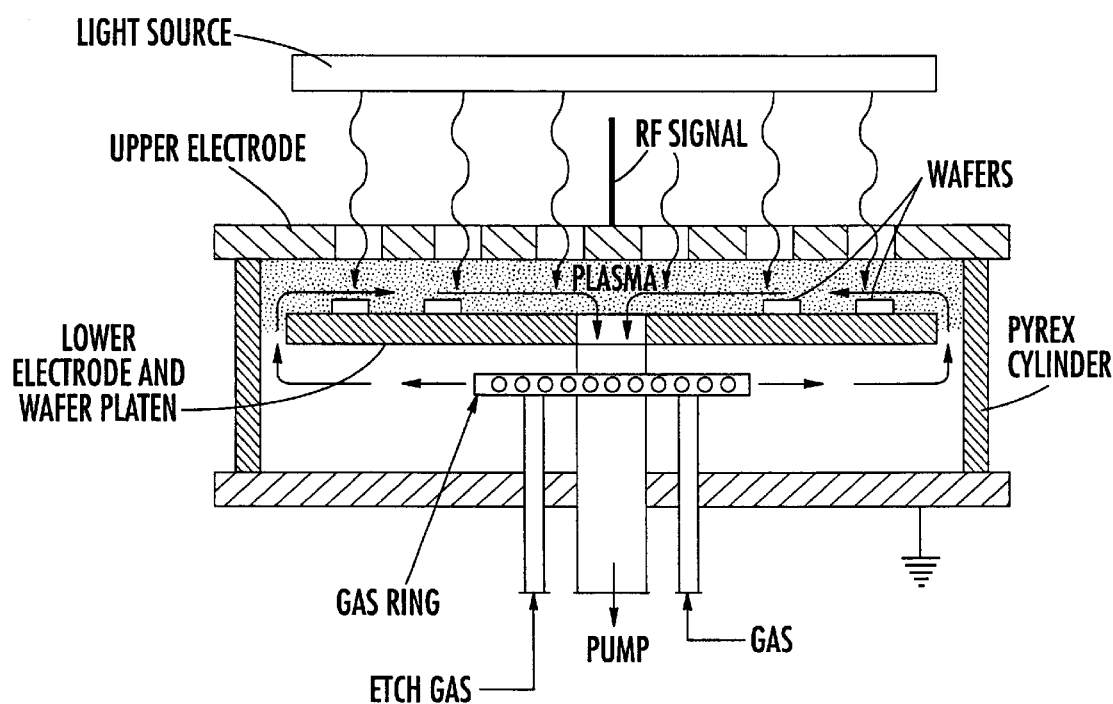
FIG. 6 is a parallel plate plasma etching system modified according to the present invention for illuminating the wafers subject to an etching process.

FIG. 6 shows a suitably modified structure of the reactor illustrated in FIG. 5 according to the present invention. The upper electrode, which forms the top cover of the chamber, is provided with a plurality of transparent windows. Through these transparent windows, the wafers being supported on the grounded wafer plate are illuminated using one or more light sources conveniently disposed outside of the reactor's chamber.

Figure 7:
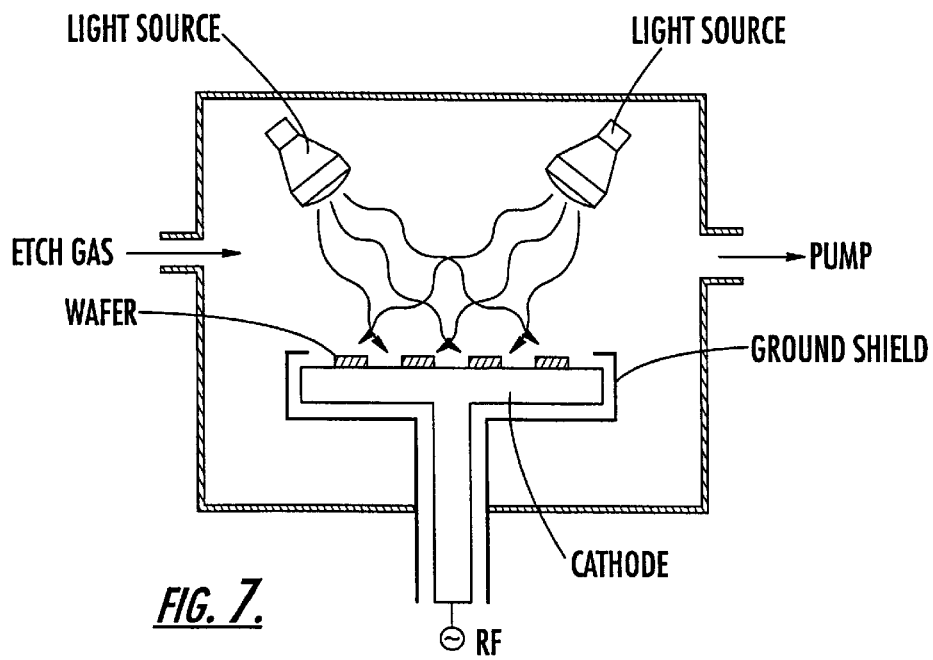
FIG. 7 is a scheme using an RF diode system for reactive ion etching according to the present invention.

Another reactor that is commonly employed in the processes of fabrication of semiconductor devices is illustrated in FIG. 7. The configuration of the reactor supports plasma etching with reactive ions (RIE). In this case, the radio frequency energy is supplied through an electrode (cathode) onto which the wafers to be treated are placed. The internal grounded parts of the reactor act as another electrode (anode).

In this type of reactor, the cathode area, which is the wafer plate, is much less that the anode area represented by the confinement walls of the chamber. The plasma completely fills the reactor chamber. A grounded screen opposite the bottom face of the wafer plate and surrounding the stem thereof prevents these parts from being etched.

Figure 8:
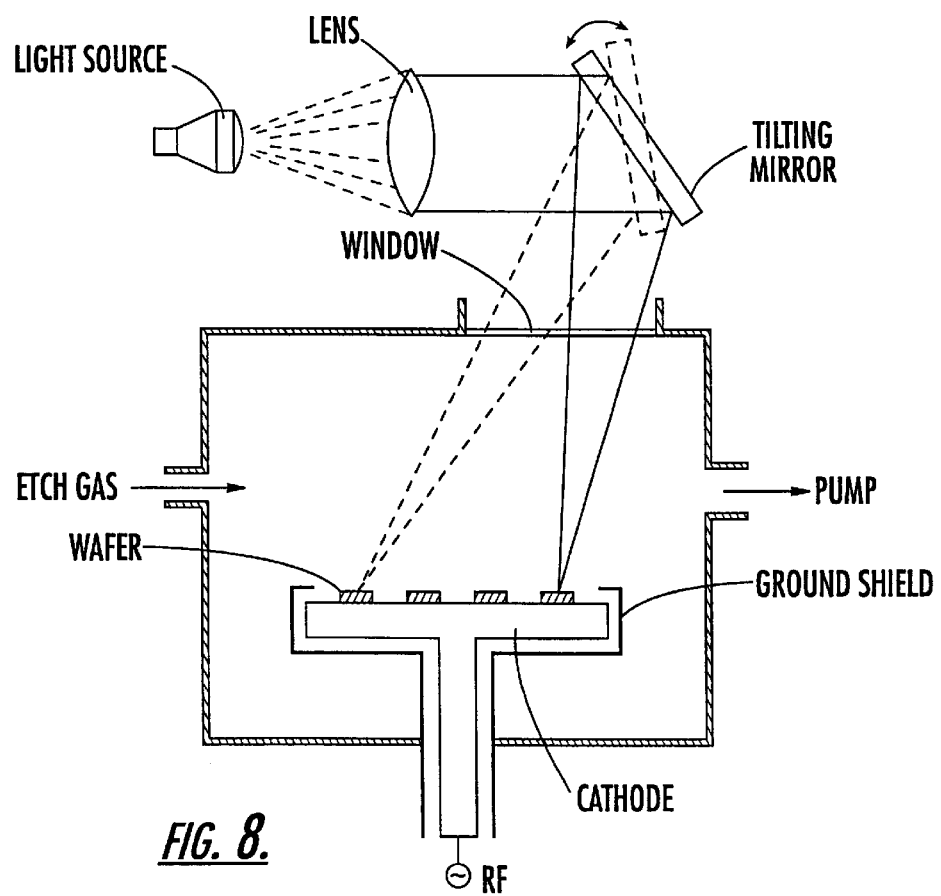
FIG. 8 is another embodiment of the scheme illustrated in FIG. 7 wherein the reactor is modified.

According to the present invention, appropriate light sources may be easily installed inside the chamber because of the generally ample internal volume available. It is also possible to install the required light sources external to the plasma treatment chamber by providing adequate transparent windows. FIG. 8 illustrates an alternative embodiment wherein the wafers are illuminated by sequentially scanning their surfaces with a focused light beam implemented with means fitted outside the treatment chamber, including a motorized tilting-mirror.

That which is claimed is:

1. A method for fabricating a semiconductor device comprising the steps of:

forming at least one diffused region in a semiconductor substrate;

depositing at least one dielectric layer and at least one conductive layer stacked on the at least one diffused region;

patterning by masking and etching the at least one dielectric layer and the at least one conductive layer, at least one of the depositing and etching steps being carried out in a plasma by placing the semiconductor substrate on a wafer support defining an electrode that is biased in gases ionized at a sub-atmospheric pressure with respect to another electrode;

forming protective junctions in the semiconductor substrate functionally connected to conductive portions of the at least one conductive layer exposed to the plasma for providing electrical discharge paths for electrical charges picked up by the exposed conductive portions to limit a level of induced voltages to preserve the integrity of the at least one dielectric layer coupled; and illuminating a surface of the semiconductor substrate during the at least one plasma step with electromagnetic radiation to enhance a reverse current through the protective junctions.

2. A method according to claim 1, wherein the step of illuminating is performed with electromagnetic radiation in a visible spectrum.

3. A method according to claim 1, wherein the step of illuminating is performed with electromagnetic radiation in a UV spectrum.

4. A method according to claim 1, wherein the step of illuminating is performed using a source comprising at least one of an incandescent lamp, a high pressure gas discharge lamp, a low pressure gas discharge lamp, a halogen lamp, and a laser.

5. A method according to claim 1, wherein the step of illuminating is at an illumination level greater than about 1 mW/cm².

6. A method according to claim 1, wherein the step of forming the protective junctions comprises forming at least one diode.

7. A method according to claim 6, wherein the at least one diode is a Zener diode.

8. A method for protecting a dielectric layer in a semiconductor device comprising at least one conductive layer on the dielectric layer, and at least one protective junction connected to conductive portions of the at least one conductive layer exposed to a plasma, the method comprising the step of:

illuminating a surface of the semiconductor device during exposure to the plasma with electromagnetic radiation to enhance a reverse current through the at least one protective junction.

9. A method according to claim 8, wherein the step of illuminating is performed with electromagnetic radiation in a visible spectrum.

10. A method according to claim 8, wherein the step of illuminating is performed with electromagnetic radiation in a UW spectrum.

11. A method according to claim 8, wherein the step of illuminating is performed using a source comprising at least one of an incandescent lamp, a high pressure gas discharge lamp, a low pressure gas discharge lamp, a halogen lamp, and a laser.

12. A method according to claim 8, wherein the step of illuminating is at an illumination level greater than about 1 mW/cm².

13. A method according to claim 8, wherein the at least one protective junction comprises at least one diode.

14. A method according to claim 13, wherein the diode is a Zener diode.

* * * * *